(12) United States Patent
Ke et al.

(10) Patent No.: US 11,169,894 B1
(45) Date of Patent: Nov. 9, 2021

(54) CONTROL METHOD FOR A MEMORY DEVICE

(71) Applicant: NS POLES TECHNOLOGY CORP., Zhuhai (CN)

(72) Inventors: Yu Chou Ke, Zhuhai (CN); Shih Hong Jheng, Zhuhai (CN); Chun Chia Chen, Zhuhai (CN)

(73) Assignee: NS Poles Technology Corp., Zhuhai (CN)

( * ) Notice: Subject to any disclaimer, the term of this patent is extended or adjusted under 35 U.S.C. 154(b) by 0 days.

(21) Appl. No.: 17/128,406

(22) Filed: Dec. 21, 2020

(30) Foreign Application Priority Data

Sep. 17, 2020 (TW) .................................. 109132028

(51) Int. Cl.
*G06F 11/20* (2006.01)
*G11C 29/00* (2006.01)
*G11B 20/18* (2006.01)

(52) U.S. Cl.
CPC ........ *G06F 11/2094* (2013.01); *G11B 20/182* (2013.01); *G11C 29/70* (2013.01); *G06F 2201/82* (2013.01)

(58) Field of Classification Search
None
See application file for complete search history.

(56) References Cited

U.S. PATENT DOCUMENTS

| 10,545,804 | B2 * | 1/2020 | Shinbashi | G11C 29/52 |
| 10,802,909 | B2 * | 10/2020 | Fackenthal | H03M 13/43 |
| 2012/0166904 | A1 * | 6/2012 | Bandholz | G06F 11/1048 |
| | | | | 714/746 |
| 2015/0254136 | A1 * | 9/2015 | Hoya | G06F 11/1012 |
| | | | | 714/764 |
| 2016/0005495 | A1 * | 1/2016 | Lasser | G06F 12/0246 |
| | | | | 711/103 |

\* cited by examiner

*Primary Examiner* — Guerrier Merant
(74) *Attorney, Agent, or Firm* — Rosenberg, Klein & Lee (57) ABSTRACT

A control method for a memory device uses an inverting data to label that a data stored in a memory block is in an inverting state or a non-inverting state. According to the inverting data, the number of bits whose data states is changed is lower than a half of total bits in the memory block in writing operation. Therefore, an energy consumption of the memory device can reduce. The control method of the present invention also can utilize the inverting data to label a memory block with a defective bit and to select a spare block to repair the memory block with a defective bit.

7 Claims, 6 Drawing Sheets

|    | WIB |   |
|----|-----|---|
| R1 | X   | 0 |
| R2 | X   | 1 |
| R3 | 0   | X |
| R4 | 1   | X |
| R5 | X   | X |

CONTROL METHOD FOR A MEMORY DEVICE

This application claims priority of Application No. 109132028 filed in Taiwan on 17 Sep. 2020 under 35 U.S.C. § 119; the entire contents of all of which are hereby incorporated by reference.

BACKGROUND OF THE INVENTION

Field of the Invention

The present invention relates to a control method for a memory device, particularly to a control method which can save power, repair defective bits and prolong a lifetime of a memory device.

Description of the Prior Art

In conventional random access memories, such as the magnetoresistive random access memory (MRAM), the resistive random access memory (RRAM), the ferroelectric random access memory (FRAM), a writing operation requires large current to change data states of bits, wherein the data states can be changed from "0" to "1" or from "1" to "0". Therefore, the more the bits whose states are changed, the more the energy that is consumed in writing operations. Besides, if the states of data are varied too frequently, the durability and reliability of bits will be decreased, and the service life of RANI will be shortened.

In the conventional technology, defective bits of RANI are repaired in the manufacture process. When defective bits occur during the RAM use, the defective bits will be repaired with an error-correcting code (ECC). However, the ECC technology requires support from other components, such the mainboard or CPU. The conventional RAM is unlikely to repair defective bits by itself.

SUMMARY OF THE INVENTION

One objective of the present invention is to provide a control method for a memory device, which can save power, repair defective bits and prolong a lifetime of a memory device.

In one embodiment, the control method for a memory device comprises the steps of: providing an inverting data to label a first data of a memory block as in an inverting state or in a non-inverting state, wherein the inverting data has at least two bits; while a second data is written into the memory block, writing the second data or a third data into the memory block according to said first data and said inverting data, wherein the third data is obtained via inverting the second data; while a defective bit is detected in the memory block, changing at least one of the at least two bits to be in a data state of non-0 and non-1; selecting one from a plurality of spare blocks to replace the memory block, wherein the inverting data labels the selected spare block.

The present invention uses an inverting data to label the data stored in a memory block as in an inverting state or a non-inverting state, whereby while data is written into the memory block, the bits whose data state are changed are not more than a half number of the total bits in the memory block, wherefore energy consumption is decreased. Besides, the present invention uses the inverting data to label the memory block having a defective bit and select a spare block for repairing the memory block having a defective bit.

DETAILED DESCRIPTION OF THE INVENTION

Figure 1:
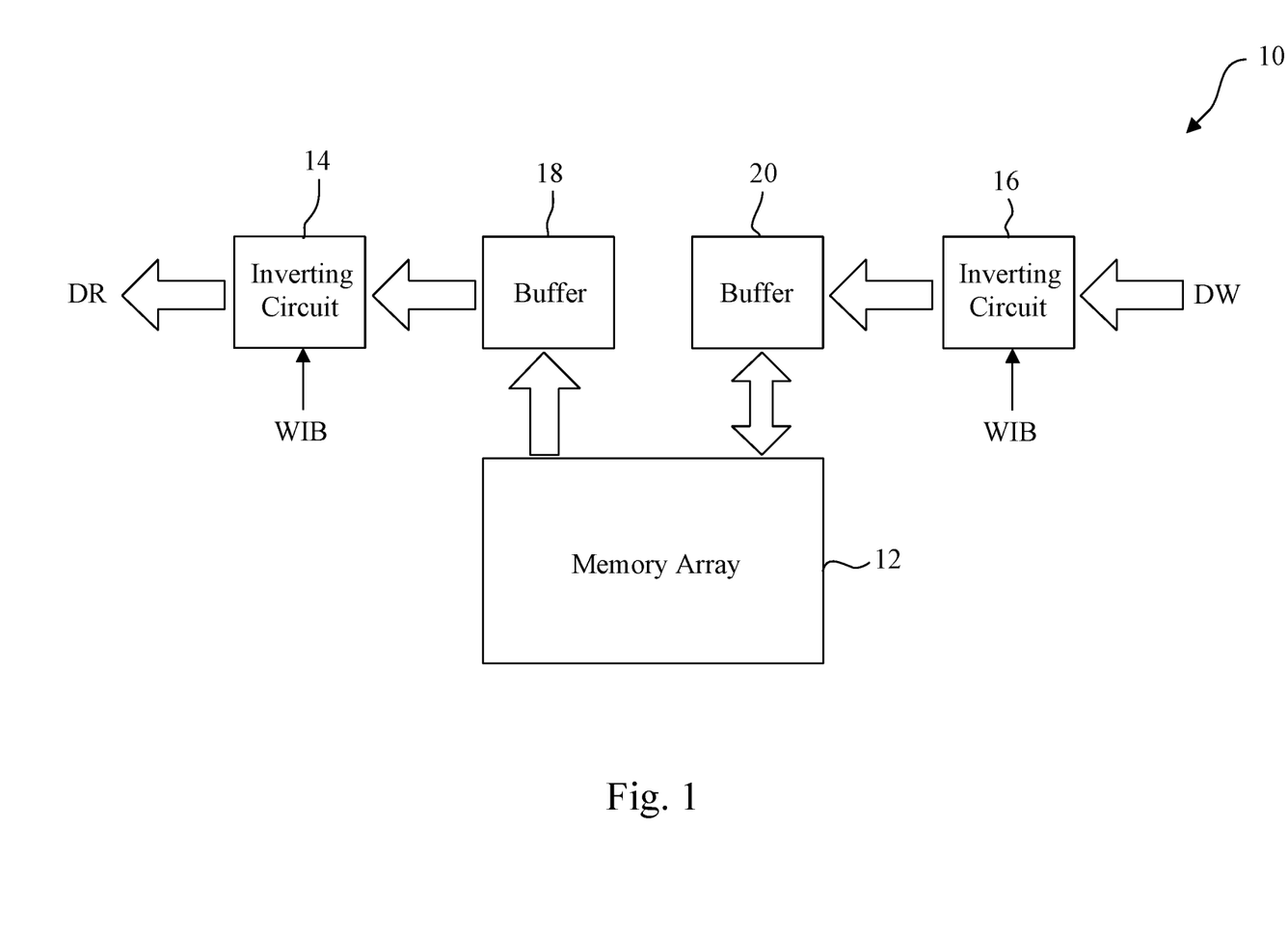
FIG. 1 schematically shows a memory device according to the present invention.
Figure 2:
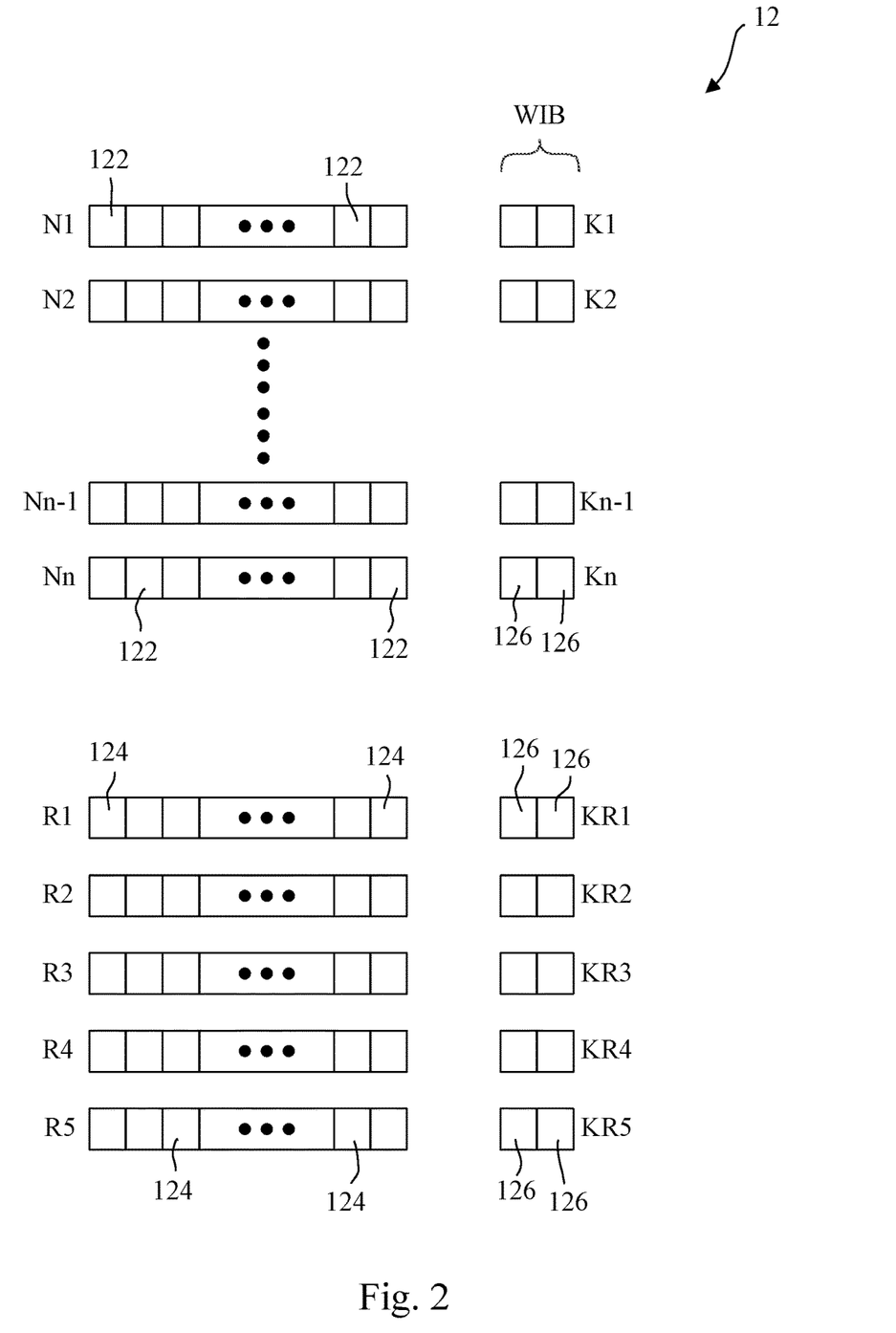
FIG. 2 schematically shows an embodiment of the memory array 12 in FIG. 1.

Refer to FIG. 1 and FIG. 2. FIG. 1 schematically shows a memory device 10 according to the present invention. FIG. 2 schematically shows an embodiment of the memory array 12 in FIG. 1. The memory device 10 comprises a memory array 12, two inverting circuits 14 and 16, and two buffers 18 and 20. The memory array 12 may be divided into two parts; the first part includes a plurality of memory blocks N1-Nn and a plurality of label blocks K1-Kn; the second part includes a plurality of spare blocks R1-R5 and a plurality of label blocks KR1-KR5. Each memory block has in (a first number) bits 122, wherein the first number in is a positive integer. Thus, each first data stored in each memory block has in bits. Each spare block has in bits 124. Each label block has 2 bits 126. The label blocks K1-Kn and the label blocks KR1-KRn are used to store inverting data WIB. The inverting data WIB stored in the label blocks K1-Kn are used to label an inverting state or a non-inverting state of the memory blocks N1-Nn. The inverting data WIB stored in the label blocks KR1-KR5 are used to label an inverting state or a non-inverting state of the spare blocks R1-R5. In the embodiment shown in FIG. 2, the memory blocks N1-Nn, the label blocks K1-Kn, the spare blocks R1-R5 and the label blocks KR1-KR5 are all in the same memory array 12. In other embodiments, the memory blocks N1-Nn, the label blocks K1-Kn, the spare blocks R1-R5 and the label blocks KR1-KR5 may be respectively disposed in different memory arrays.

Figure 3:
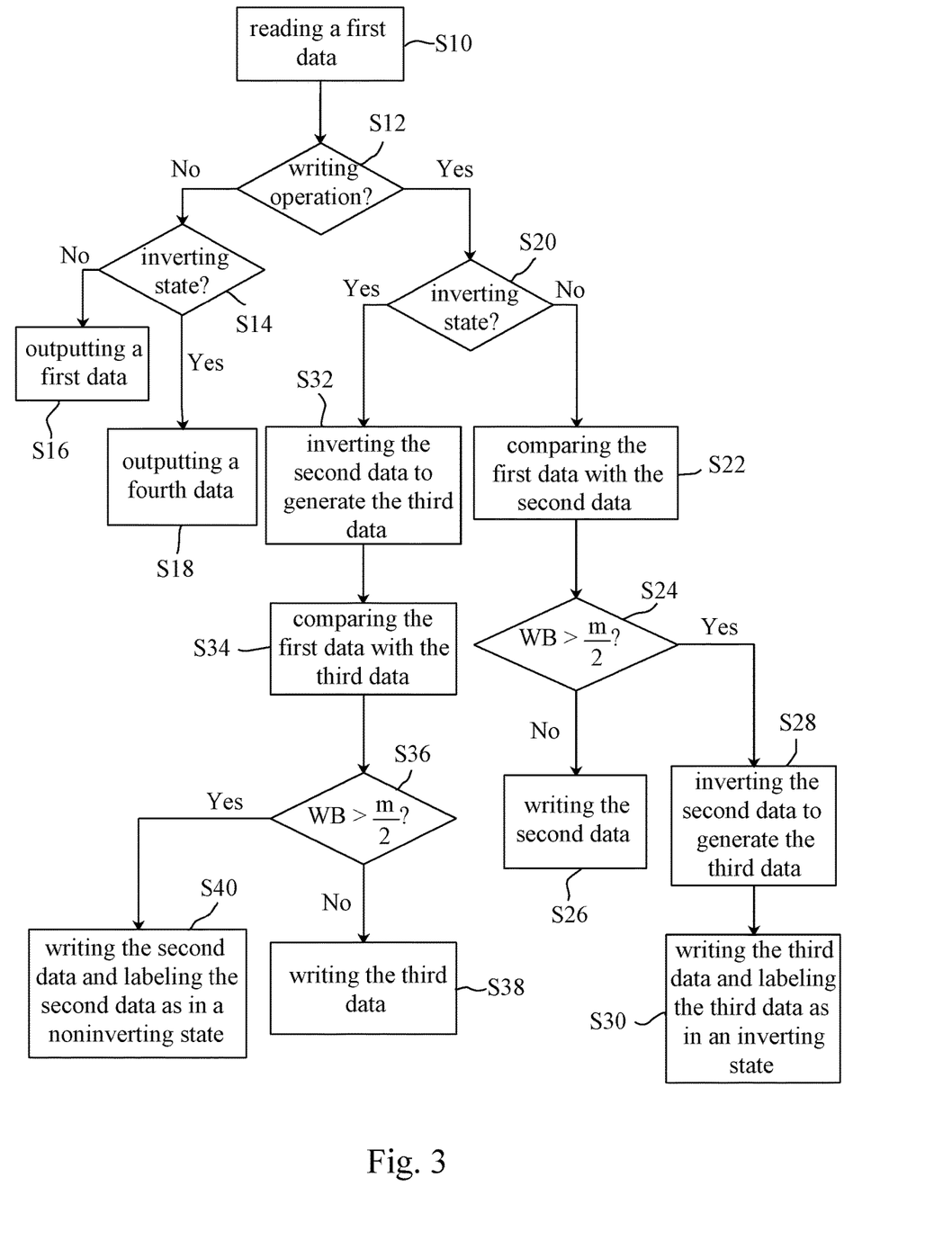
FIG. 3 shows a flowchart of the reading and writing operations of the memory device 10 according to the present invention.

FIG. 3 shows a flowchart of the reading and writing operations of the memory device 10 according to the present invention. In a step S10, while the memory device 10 receives a read/write instruction, a first data which is read from one of the memory blocks N1-Nn will be stored into two buffers 18 and 20. Herein, the operation of reading a first data from the memory block N1 is used as an exemplification. In a step S12, the memory device 10 determines whether to perform a writing operation. In a step S14, while the memory device 10 determines to perform a reading operation, the inverting circuit 14 detects the inverting data WIB in the label block K1 to determine the first data is in an inverting state or a non-inverting state. In this embodiment, while the inverting data WIB is "00" or "11", it indicates that the first data is in the non-inverting state. While the inverting data WIB is "01" or "10", it indicates that the first data is in the inverting state. The present invention is not limited to this, for example, the first data is in the inverting state while the inverse data WIB is "00" or "11", and the first data is a non-inverting state while the inverting data WIB is "01" or "10". In a step S16, while the inverting circuit 14 determines that the first data is in the non-inverting state, the inverting circuit 14 directly uses the first data in the buffer 18 as the read data DR and outputs the read data DR to an external circuit outside the memory device 10. If the inverting circuit 14 determines that the first data is in the inverting state in the step S14, the process proceeds to a step S18. In the step S18, the inverting circuit 14 inverts the first data to generate a fourth data as the read data DR and outputs the read data DR to an external circuit outside the memory device 10. For example, if the first data is "1001", the fourth data is "0110".

If the memory device 10 determines to perform a writing operation in the step S12, the memory device 10 will execute a step S20. In the step S20, the inverting circuit 16 detects the inverting data WIB of the label block K1 to determine the first data is in an inverting state or a non-inverting state. If the first data is in a non-inverting state, the inverting circuit 16 stores a second data, which is to be written, in the buffer 20. Next, the process proceeds to a step S22. In the step S22, the memory device 10 compares the first data in the buffer 18 with the second data in the buffer 20. The comparation process includes finding out the bits at the same positions but in different states in the first data and the second data, and counts the number of these bits to generate a second number WB. Next, the process proceeds to a step S24. In the step S24, determine whether the second number WB is greater than a half of the first number in. If the second number WB is smaller than m/2, the process proceeds to a step S26. In the step S26, the memory device 10 directly writes the second data into the memory block N1, and maintains the inverting data WIB, which is corresponding to the memory block N1, in the non-inverting state. If the second number WB is greater than m/2, the process proceeds to a step S28. In the step S28, the inverting circuit 16 inverts the second data to generate a third data. Next, the process proceeds to a step S30. In the step S30, the memory device 10 writes the third data into the memory block N1, and the inverting data WIB, which is corresponding to the memory block N1, will be labeled as in inverting state.

Herein, a practical embodiment is offered to explain the steps S22-S30. Suppose that the first data is "10010001". As the first data has 8 bits, the first number in is 8. Suppose that the second data in the step S22 is "10010010". After the comparison process, it can know that only the data states of last two bits of the first data "10010001" and the second data "10010010" are different. Therefore, in the step S24, the memory device 10 determines that the second number WB is 2 and smaller than a half of the first number in. Next, the process proceeds to the step S26. In the step S26, the second data "10010010" is written into the memory block N1. As only the data states of the last two bits of the first data "10010001" and the second data "10010010" are different, only the data states of the last two bits 122 in the memory block N1 need changing in writing. Suppose that the second data in the step S22 is "10001110". After the comparison process, it can know that the data states of the last five bits of the first data "10010001" and the second data "10001110" are different. Therefore, in the step S24, the memory device 10 determines that the second number WB is 5 and greater than a half of the first number in. If the second data is written into the memory block N1 in such a case, there are five bits need to change data states. It will result in a high energy consumption. In order to decrease energy consumption, the memory device 10 executes the step S28 to invert the second data and generate the third data "01110001". Next, the process proceeds to the step S30. In the step S30, the memory device 10 writes the third data "01110001" into the memory block N1 and simultaneously the inverting data WIB of label block K1 will be labeled as in inverting state. As only the data states of the first three bits of the first data "10010001" and the third data "01110001" are different, only the first three bits 122 in the memory block N1 need changing the data states in writing. Therefore, the present invention can achieve the target of saving power.

If the first data is in an inverting state in the step S20, the memory device 10 will execute a step S32. In the step S32, the inverting circuit 16 inverts the second data to generate the third data and stores the third data into the buffer 20. Next, the process proceeds to a step S34. In the step S34, the memory device 10 compares the first data in the buffer 18 with the third data in the buffer 20. After the comparison process, the memory device 10 can know that the bits whose positions are identical but whose data states are different in the first data and the third data. The memory device 10 counts the number of these bits to obtain the second number WB. Next, the process proceeds to a step S36. In the step S36, the memory device 10 determines whether the second number WB is greater than a half of the first number in. If the second number WB is smaller than m/2, the process proceeds to a step S38. In the step S38, the memory device 10 writes the third data into the memory block N1, and maintains the inverting data WIB, which is corresponding to the memory block N1, in the inverting state. If the second number WB is greater than m/2, the process proceeds to a step S40. In the step S40, the memory device 10 writes the second data into the memory block N1, and simultaneously changes the inverting data WIB to be in a non-inverting state.

Herein, practical embodiment is offered to explain the steps S32-S40. Suppose that the first data is "01101110". As the first data has 8 bits, the first number in is 8. As the first data is labelled as in an inverting state in the step S32, the inverting circuit 16 inverts the second data "01110001" to be a third data "10001110" and stores the third data in the buffer 20. The memory device 10 compares the first data "01101110" and the third data "10001110" so as to know that the data states of the first three bits are different. Thus, the memory device determines that the second number WB is 3 and smaller than a half of the first number in. Next, the process proceeds to the step S38. In the step S38, the memory device 10 writes the third data "10001110" into the memory block N1 and maintains the inverting data WB of the label block K1 unchanged. As only the data states of the first three bits are different in the first data "01101110" and the third data "10001110", only the first three bits 122 of the memory block N1 need changing in writing. In another embodiment, suppose that the second data is "01101001", and a third data "10010110" is generated in the step S32. Next, in the step 34 and the step S36, the memory device 10 knows that the data states of the first five bits are different in the first data "01101110" and the third data "10010110" and determines that the second number WB is greater than a half of the first number in. In order to decrease energy consumption, the memory device 10 executes the step S40. In the step S40, the memory device 10 writes the second data into the memory block N1 and changes the inverting data of the label block K1 to be in the non-inverting state. As only the date states of the last three bits are different for the first data "01101110" in the memory block N1 and the second data "01101001", only the data states of the last three bits 122 of the memory block N1 need changing in writing. Therefore, the present invention can achieve the target of saving power.

Herein, the label block K1 in FIG. 2 is used as an exemplification. The inverting data WIB of the label block K1 has two bits, wherein "00" and "11" may be used to express a non-inverting state; "01" and "10" may be used to express an inverting state. If the data states of the bits 126 are changed too frequently, the durability and reliability of the bits 126 will be lowered, and a lifetime of the label block K1 will be shortened. In order to decrease the frequency of changing the states of the bits 126, the inverting data WIB may be changed in an order. For example, the inverting data WIB is changed in an order: "00" to "01"; "01" to "11"; "11" to "10"; "10" to "00". In other words, the inverting data WIB is changed cyclically in a sequence: "00", "01", "11", and "10". Thus, only one bit 126 is changed each time in the label block K1, and the data state of the same bit 126 would not be changed twice successively. Then, the frequency of changing the states of the bits 126 is decreased, and the lifetime of the label block K1 is increased. The present invention does not limit the number of the bits of the inverting data WIB. For example, the inverting data WIB may have three bits. In such a case, "000", "011" and "110" may be used to express a non-inverting state; "001", "111" and "100" may be used to express an inverting state. The inverting data WIB may be changed in a sequence: "000", "001", "011", "111", "110" and "100". In another embodiment, "000", "011" and "110" may be used to express an inverting state of the inverting data WIB; "001", "111" and "100" may be used to express a non-inverting state of the inverting data WIB.

Figure 4:
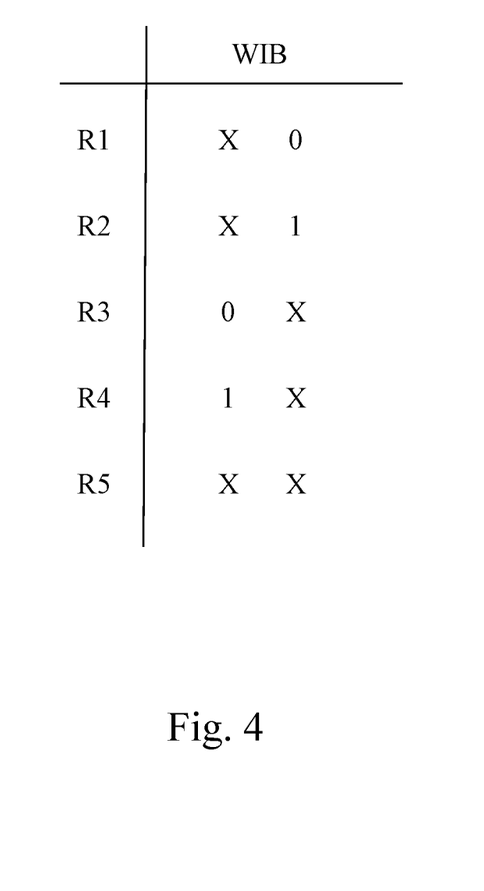
FIG. 4 shows a method that the memory device 10 repairs defective bits according to the present invention.

A third state X, which is non-0 and non-1, can be written into the bits 126 of the label blocks K1-K12 in FIG. 2. Based on the feature, the memory device 10 of the present invention can instantly repair defective bits. While a bit 122 in the memory block N1 becomes a defective bit because of overuse or other factors, at least one bit 126 of the label block K1 can be changed to have a data state X to indicate that the memory block N1 has a defective bit. The memory device 10 of the present invention can select one of the spare blocks R1-R5 to replace the memory block N1 according to the inverting data WIB. FIG. 4 shows the relationship between the inverting data WIB and the spare blocks R1-R5. While the memory device 10 detects that the inverting data WIB of the memory block N1 is "X0", the memory device 10 will select the spare block R1 to replace the memory block N1. While the memory device 10 detects that the inverting data WIB of the memory block N1 is "X1", the memory device 10 will select the spare block R2 to replace the memory block N1. While the memory device 10 detects that the inverting data WIB of the memory block N1 is "0X", the memory device 10 will select the spare block R3 to replace the memory block N1. While the memory device 10 detects that the inverting data WIB of the memory block N1 is "1X", the memory device 10 will select the spare block R4 to replace the memory block N1. While the memory device 10 detects that the inverting data WIB of the memory block N1 is "XX", the memory device 10 will select the spare block R5 to replace the memory block N1. The embodiment in FIG. 2 uses five spare blocks R1-R5. However, the present invention is not limited by this embodiment. The present invention may increase or decrease the number of the spare blocks according to requirement. The number of the bits of the inverting data WIB may vary with the number of the spare blocks.

Figure 5:
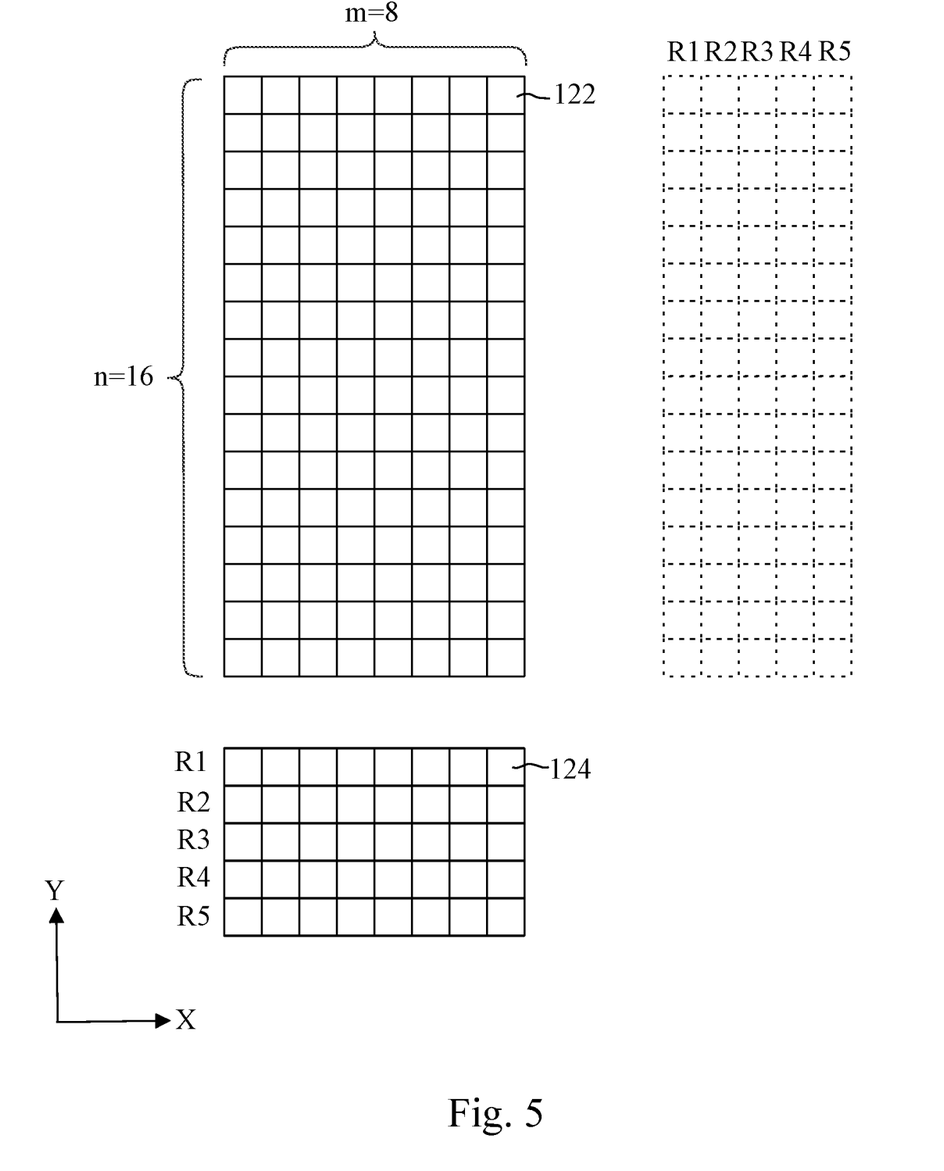
FIG. 5 shows a first arrangement embodiment of the memory blocks and the spare blocks according to the present invention.
Figure 6:
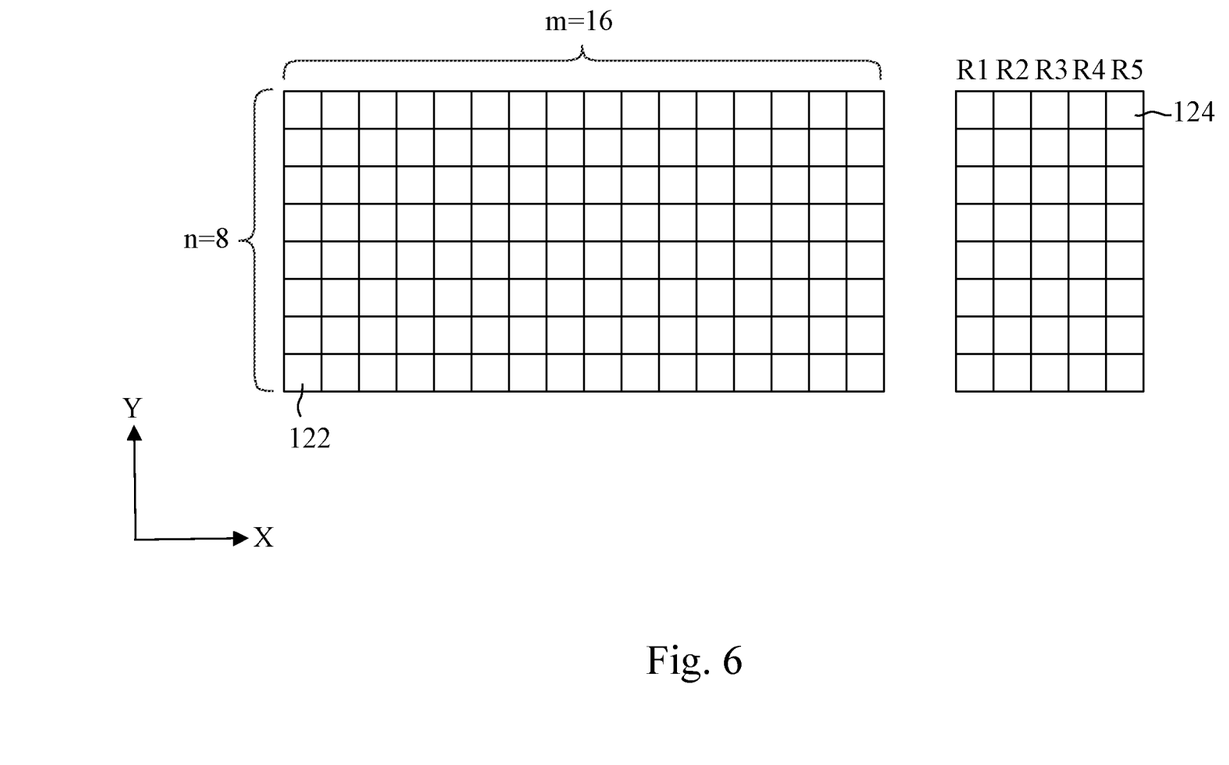
FIG. 6 shows a second arrangement embodiment of the memory blocks and the spare blocks according to the present invention.

In the embodiment shown in FIG. 2, a plurality of bits 122 forms an n×m array. The arrangement direction of the spare blocks R1-R5 can depend on the relationship of n and m to achieve a better repair efficiency. Refer to FIG. 5. While n>m (e.g. n=16 and m=8), the spare blocks R1-R5 can be arranged along the Y direction to achieve a better repair efficiency, as shown by the solid lines. In details, while the n×m array of FIG. 5 has a defective bit, the spare blocks R1-R5 arranged along the Y direction only need to use 8 bits 124 to replace the memory block having the defective bit. It means that 8 bits 124 are used to repair a defective bit in such a case. If the spare blocks R1-R5 are arranged along the X direction (as shown by the dotted lines), 16 bits are used to replace the memory block having the defective bit. It means that 16 bits are used to repair a defective bit. Therefore, while n>m, arranging the spare blocks R1-R5 along the Y direction will acquire a better repair efficiency. While n<m (e.g. n=8 and m=16), arranging the spare blocks R1-R5 along the X direction will acquire a better repair efficiency, as shown in FIG. 6.

The embodiments have been described above to demonstrate the present invention to enable the persons skilled in the art to understand, make, and use the present invention. However, these embodiments are only to exemplify the present invention but not to limit the scope of the present invention. Any modification or variation according to the spirit, principle, and/or characteristic of the present invention is to be also included by the scope of the present invention, which is based on the claims stated below and the equivalents thereof.

What is claimed is:

1. A control method for a memory device, comprising the steps of:
   A. providing an inverting data to label a first data of a memory block as an inverting state or a non-inverting state, wherein said inverting data has at least two bits;
   B. while a second data is written into said memory device, writing said second data or a third data into said memory block according to said first data and said inverting data, wherein said third data is generated via inverting said second data;
   C. while a defective bit is detected in said memory block, changing at least one of said least two bits to be in a non-0 and non-1 state; and
   D. selecting one from a plurality of spare blocks to replace said memory block, wherein said inverting data labels said spare block selected to replace said memory block.

2. The control method according to claim 1, wherein said step B comprises while said first data is labelled as in said non-inverting state, executing following steps:
   comparing said first data with said second data, wherein each of said first data and said second data has a first number of bits;
   counting bits having identical positions and different states in said first data and said second data to generate a second number;
   if said second number is smaller than a half of said first number, writing said second data into said memory block; and
   if said second number is larger than a half of said first number, writing said third data into said memory block, and changing said inverting data to label said third data written into said memory block as in said inverting state.

3. The control method according to claim 2, wherein said step of comparing said first data with said second data comprises following steps:
   storing said first data into a first buffer;
   storing said second data into a second buffer; and
   comparing said first data in said first buffer with said second data in said second buffer.

4. The control method according to claim 2, wherein changing said inverting data is to change one bit of said at least two bits of said inverting data according to a preset order.

5. The control method according to claim 1, wherein said step B comprises while said first data is labelled as in said inverting state, executing following steps:
- inverting said second data into said third data;
- comparing said first data with said third data, wherein each of said first data, said second data and said third data has a first number of bits;
- counting bits having identical positions and different states in said first data and said second data to generate a second number;
- if said second number is smaller than a half of said first number, writing said third data into said memory block; and
- if said second number is larger than a half of said first number, writing said second data into said memory block, and changing said inverting data to label said second data written into said memory block as in said non-inverting state.

6. The control method according to claim 5, wherein said step of comparing said first data with said third data comprises following steps:
- storing said first data into a first buffer;
- storing said third data into a second buffer; and
- comparing said first data in said first buffer with said third data in said second buffer.

7. The control method according to claim 5, wherein changing said inverting data is to change one bit of said at least two bits of said inverting data according to a preset order.

* * * * *